United States Patent
Igarashi

(10) Patent No.: US 12,114,577 B2
(45) Date of Patent: Oct. 8, 2024

(54) MAGNETORESISTANCE MEMORY DEVICE AND METHOD OF MANUFACTURING MAGNETORESISTANCE MEMORY DEVICE

(71) Applicant: Kioxia Corporation, Tokyo (JP)

(72) Inventor: Taichi Igarashi, Seoul (KR)

(73) Assignee: Kioxia Corporation, Tokyo (JP)

( * ) Notice: Subject to any disclaimer, the term of this patent is extended or adjusted under 35 U.S.C. 154(b) by 415 days.

(21) Appl. No.: 17/465,696

(22) Filed: Sep. 2, 2021

(65) Prior Publication Data
US 2022/0085278 A1   Mar. 17, 2022

(30) Foreign Application Priority Data

Sep. 17, 2020 (JP) ................ 2020-156465

(51) Int. Cl.
| | | |
|---|---|---|
| *H10N 50/80* | (2023.01) | |
| *H10B 61/00* | (2023.01) | |
| *H10N 50/01* | (2023.01) | |

(52) U.S. Cl.
CPC ............ *H10N 50/80* (2023.02); *H10B 61/10* (2023.02); *H10N 50/01* (2023.02)

(58) Field of Classification Search
CPC ........ H10N 50/80; H10N 50/01; H10N 50/10; H10B 61/10; H01L 27/105; G11C 11/02; G11C 13/0009
See application file for complete search history.

(56) References Cited

U.S. PATENT DOCUMENTS

| | | | |
|---|---|---|---|
| 8,558,354 B2 | 10/2013 | Mizushima et al. | |
| 2018/0315796 A1* | 11/2018 | Lee ................... | H10N 50/85 |
| 2019/0295639 A1* | 9/2019 | Nakazawa ......... | G11C 13/0026 |
| 2020/0168794 A1 | 5/2020 | Soncini et al. | |
| 2021/0050511 A1* | 2/2021 | Lin ..................... | H10N 50/80 |
| 2021/0408020 A1* | 12/2021 | Makala .............. | H10B 61/10 |
| 2021/0408114 A1* | 12/2021 | Lille .................. | H10N 50/01 |

FOREIGN PATENT DOCUMENTS

| | | |
|---|---|---|
| JP | 2013153104 A | 8/2013 |
| JP | 5624425 B2 | 11/2014 |
| JP | 2018511164 A | 4/2018 |

* cited by examiner

*Primary Examiner* — Nilufa Rahim
(74) *Attorney, Agent, or Firm* — Holtz, Holtz & Volek PC

(57) ABSTRACT

In general, according to one embodiment, a magnetoresistance memory device includes: a first conductor; a second conductor on the first conductor; a first element on the second conductor; a third conductor on the first element; and a first layer stack on the third conductor. The second conductor is amorphous. The first element includes a silicon oxide introduced with a dopant. The first layer stack includes a first magnetic layer, a second magnetic layer, and a first insulating layer between the first magnetic layer and the second magnetic layer.

17 Claims, 15 Drawing Sheets

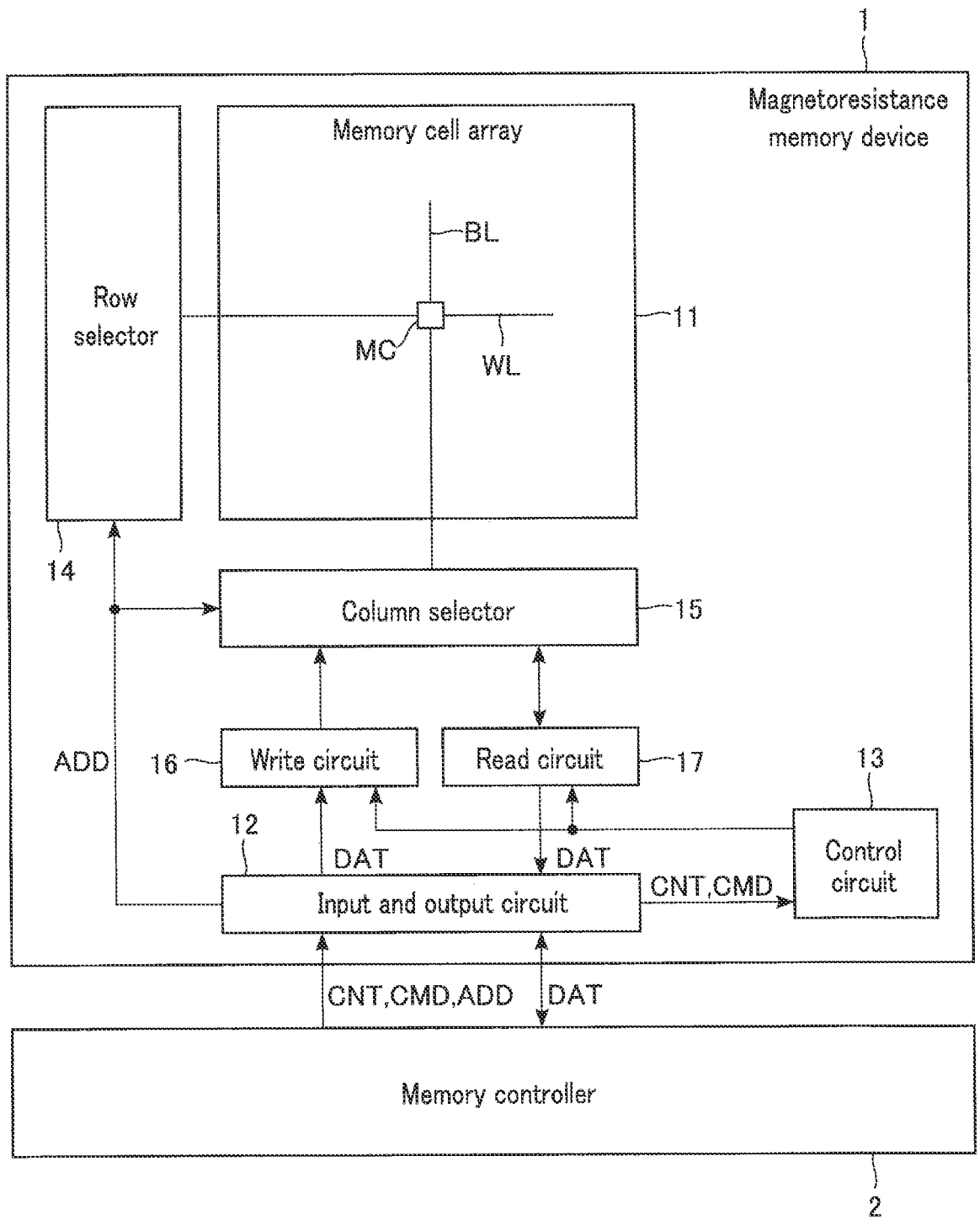
F I G. 1

MAGNETORESISTANCE MEMORY DEVICE AND METHOD OF MANUFACTURING MAGNETORESISTANCE MEMORY DEVICE

CROSS-REFERENCE TO RELATED APPLICATIONS

This application is based upon and claims the benefit of priority from Japanese Patent. Application No. 2020-156465, filed Sep. 17, 2021, the entire contents of which are incorporated herein by reference.

FIELD

Embodiment described herein relate generally to a magnetoresistance memory device and a method of manufacturing a magnetoresistance memory device.

BACKGROUND

Memory devices using a magnetoresistance effect element are known.

BRIEF DESCRIPTION OF THE DRAWINGS

FIG. 1 shows functional blocks of a memory device according to a first embodiment.

DETAILED DESCRIPTION

Figure 2:
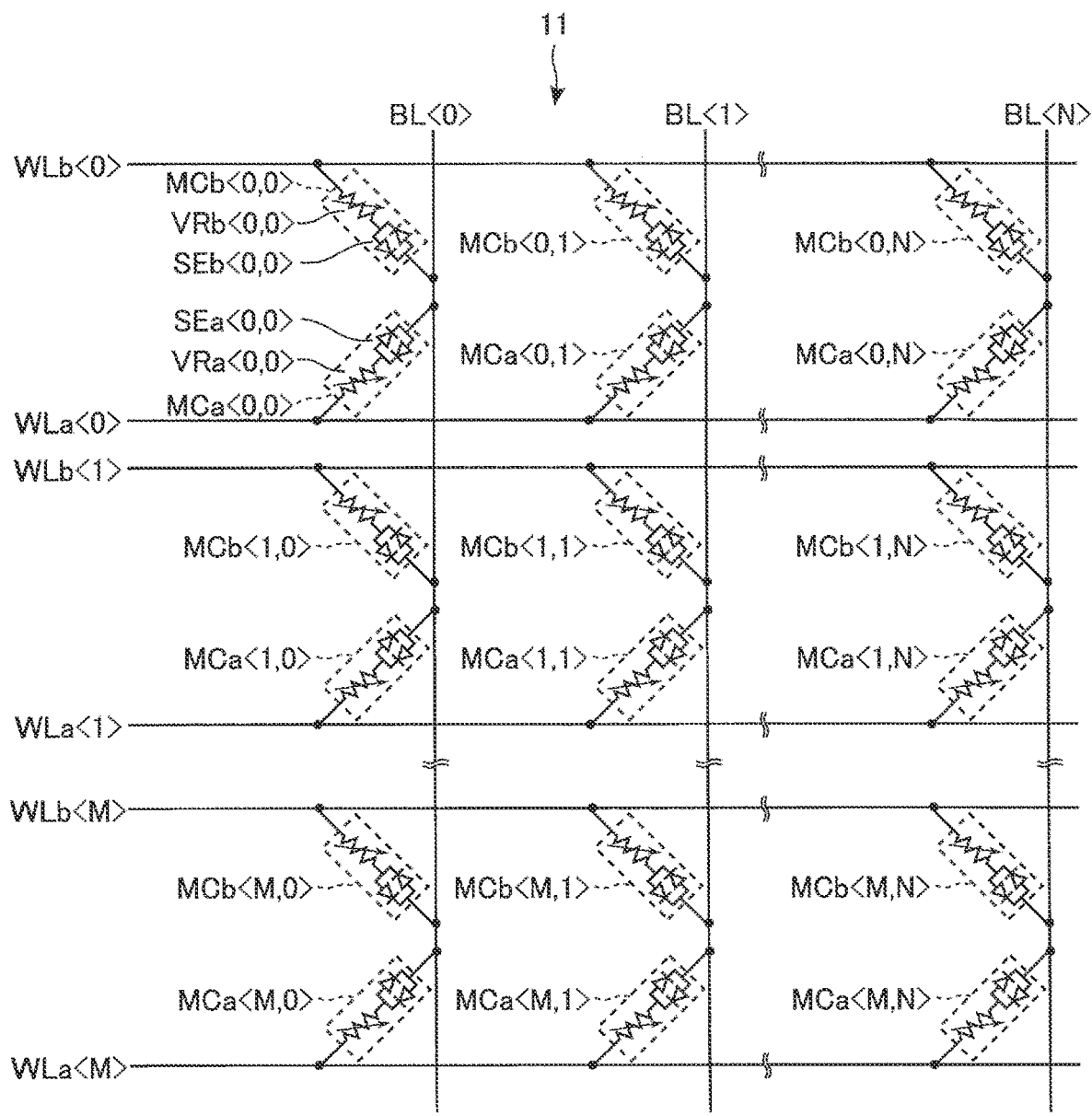
FIG. 2 is a circuit diagram of a memory cell array according to the first embodiment.

In general, according to one embodiment, a magnetoresistance memory device includes: a first conductor; a second conductor on the first conductor; a first element on the second conductor; a third conductor on the first element; and a first layer stack on the third conductor. The second conductor is amorphous. The first element includes a silicon oxide introduced with a dopant. The first layer stack includes a first magnetic layer, a second magnetic layer, and a first insulating layer between the first magnetic layer and the second magnetic layer.

Embodiments will now be described with reference to the figures. In the following description, components with substantially the same functionalities and configurations will be referred to by the same reference numerals, and repeated descriptions may be omitted. In order to distinguish components having substantially the same function and configuration from each other, an additional numeral or letter may be added to the end of each reference numeral.

The figures are schematic, and the relation between the thickness and the area of a plane of a layer and the ratio of thicknesses of layers may differ from the actual ones. The figures may include components which differ in relations and/or ratios of dimensions in different figures. The entire description of a particular embodiment also applies to another embodiment unless explicitly mentioned otherwise or obviously eliminated. Each embodiment illustrates a device and a method for materializing the technical idea of that embodiment, and the technical idea of each embodiment does not limit the quality of the material, shape, structure, arrangement of components, etc. to those that will be described below.

The embodiments will be described by using an xyz orthogonal coordinate system. In the description below, the term "below" as well as the terms derived therefrom and the terms related thereto refer to a position having a smaller coordinate on the z-axis, and the term "above" as well as the terms derived therefrom and the terms related thereto refer to a position having a larger coordinate on the z-axis.

1. First Embodiment 1.1. Structure (Configuration)
1.1.1. Overall Structure

FIG. 1 shows functional blocks of a magnetoresistance memory device according to a first embodiment. As shown in FIG. 1, a magnetoresistance memory device 1 includes a memory cell array 11, an input and output circuit 12, a control circuit 13, a row selector 14, a column selector 15, a write circuit 16, and a read circuit 17.

The memory cell array 11 includes memory cells MC, word lines WL, and bit lines EL. The memory cells MC can store data in a non-volatile manner. Each memory cell MC is coupled to a single word line WL and a single bit line BL. Each word line WL is associated with a row. Each bit line EL is associated with a column. Selection of one row and selection of one or more columns specify one or more memory cells MC.

The input and output circuit 12 receives various types of a control signal CNT, various types of a command CMD, an address signal ADD, and data (write data) DAT, for example, from a memory controller 2, and transmits data (read data) DAT to, for example, the memory controller 2.

The row selector 14 receives the address signal ADD from the input and output circuit 12, and brings a single word line WL associated with the row that is specified by the received address signal ADD into a selected state. The column selector 15 receives the address signal ADD from the input and output circuit 12 and brings bit lines DL associated with the column that is specified by the received address signal ADD into a selected state. The control circuit 13 receives the control signal CNT and the command CMD from the input and output circuit 12.

The control circuit 13 controls the write circuit 16 and the read circuit 17 based on control instructed by the control signal CNT and the command CMD. Specifically, the control circuit 13 supplies voltages used for data writing to the write circuit 16 during the data writing to the memory cell array 11. Further, the control circuit 13 supplies voltages used for data reading to the read circuit 17 during the reading of data from the memory cell array 11.

The write circuit 16 receives write data DAT from the input and output circuit 12 and supplies the voltages used for data writing to the column selector 15 based on the control by the control circuit 13 and the write data DAT.

The read circuit 17 includes a sense amplifier, and based on the control of the control circuit 13, uses the voltages used for data reading to determine data stored in the memory cells MC.

The determined data is supplied to the input and output circuit 12 as the read data DAT.

1.1.2. Circuit Configuration of Memory Cell Array

FIG. 2 is a circuit diagram of a memory cell array 11 according to the first embodiment. As shown in FIG. 2, the memory cell array 11 includes (M+1) word lines WLa (WLa<0>, WLa<1>, . . . , and WLa<M>) and (M+1) word lines WLb (WLb<0>, WLb<1>, . . . , and WLb<M>), where M is a natural number. The memory cell array 11 also includes (N+1) bit lines BL (BL<0>, . . . , BL<N>), . . . , and BL<N>), where N is a natural number.

Each of the memory cells MC (MCa and MCb) includes two nodes, and is coupled, at its first node, to a single word line WL and coupled, at its second node, to a single bit line BL. More specifically, the memory cells MCa encompass memory cells MCa<$\alpha$, $\beta$> for all combinations of $\alpha$ and $\beta$, where $\alpha$ is every integer equal to or greater than 0 and equal to or less than M, and $\beta$ is every integer equal to or greater than 0 and equal to or less than N, and the memory cell MCa<$\alpha$, $\beta$> is coupled between the word line WLa<$\alpha$> and the bit line BL<$\beta$>.

Similarly, the memory cells MCb encompass memory cells MCb<$\alpha$, $\beta$>, for all combinations of $\alpha$ and $\beta$, where $\alpha$ is every integer equal to or greater than 0 and equal to or less than M, and $\beta$ is every integer equal to or greater than 0 and equal to or less than N, and the memory cell MCb<$\alpha$, $\beta$> is coupled between the word line WLb<$\alpha$> and the bit line BL<$\beta$>.

Each memory cell MC includes a single magnetoresistance effect element VR (VRa or VRb) and a single switching element SE (SEa or SEb). More specifically, the memory cell MCa<$\alpha$, $\beta$> includes a magnetoresistance effect element VRa<$\alpha$, $\beta$> and a switching element SEa<$\alpha$, $\beta$> for all combinations of $\alpha$ and $\beta$, where $\alpha$ is every integer equal to or greater than 0 and equal to or less than M, and $\beta$ is every integer equal to or greater than 0 and equal to or less than N. Each memory cell MCb<$\alpha$, $\beta$> includes a magnetoresistance effect element VRb<$\alpha$, $\beta$> and a switching element SEb<$\alpha$, $\beta$> for all combinations of $\alpha$ and $\beta$, where $\alpha$ is every integer equal to or greater than 0 and equal to or less than M, and $\beta$ is every integer equal to or greater than 0 and equal to or less than N.

In each memory cell MC, the magnetoresistance effect element VR and the switching element SE are coupled in series. The magnetoresistance effect element VR is coupled to a single word line WL, and the switching element SE is coupled to a single bit line EL.

The magnetoresistance effect element VR can switch between a low-resistance state and a high-resistance state. The magnetoresistance effect element VR can store 1-bit data, using the difference in the two resistance states.

The switching element SE can be a switching element described below, for example. The switching element includes two terminals, and, when a voltage smaller than a first threshold is applied in a first direction between the two terminals, the switching element is in a high-resistance state, i.e., electrically non-conductive (in an OFF state). In contrast, when a voltage equal to or greater than a first threshold is applied in the first direction between the two terminals, the switching element is in a low-resistance state, i.e., electrically conductive (in an ON state). The switching element is further equipped with a function similar to the function of switching between the high-resistance state and the low-resistance state based on the magnitude of the voltage applied in the first direction, with respect to a second direction opposite to the first direction.

By turning on or off the switching element, it is possible to perform control as to whether or not to supply a current to a magnetoresistance effect element VR coupled to the switching element, namely, whether or not to select the magnetoresistance effect element VR.

1.1.3. Structure of Memory Cell Array

Figure 3:
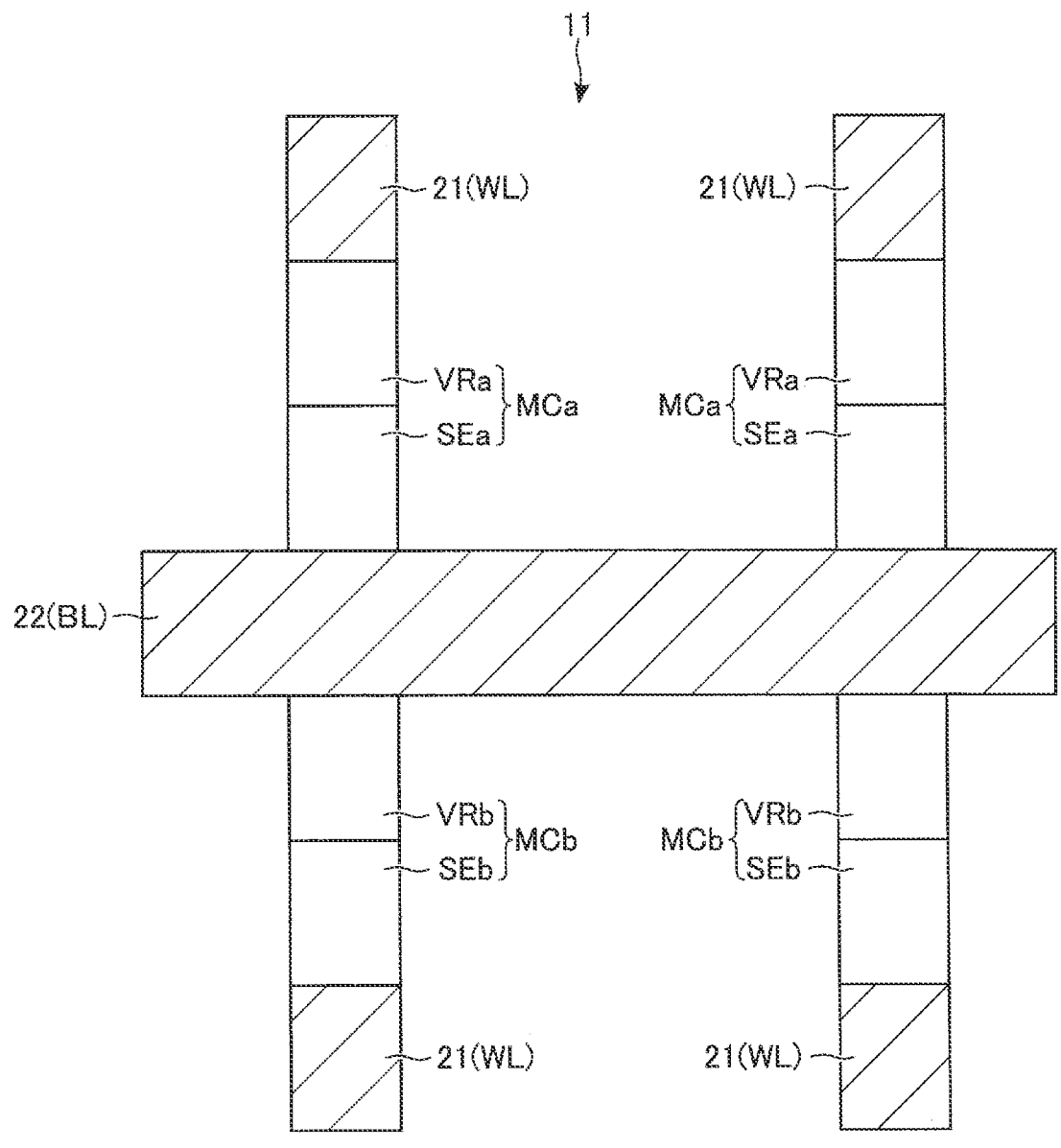
FIG. 3 shows a cross sectional structure of part of the memory cell array according to the first embodiment.
Figure 4:
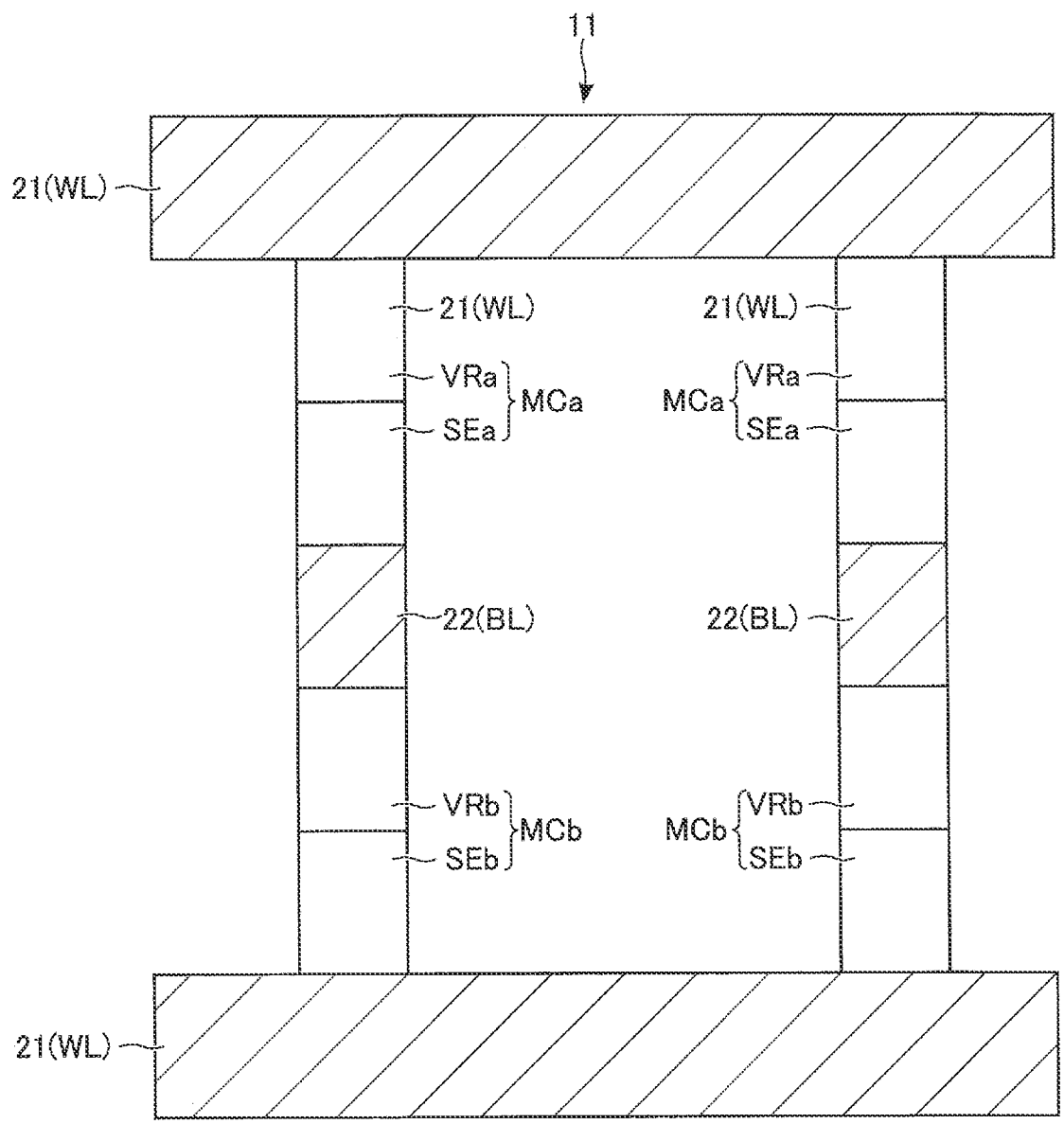
FIG. 4 shows a cross sectional structure of part of the memory cell array according to the first embodiment.

FIGS. 3 and 4 show a cross-sectional structure of part of the memory cell array 11 of the first embodiment. FIG. 3 shows the cross-section along the xz-plane, and FIG. 4 shows the cross-section along the yz-plane.

As shown in FIGS. 3 and 4, conductors 21 are provided above the semiconductor substrate (not shown). The conductors 21 extend along the y-axis, and are aligned along the x-axis. Each conductor 21 functions as a word line WL.

Each conductor 21 is coupled, at its upper surface, to the bottom surfaces of memory cells MCb. Each memory cell MCb has, for example, a circular shape in the xy-plane. The memory cells MCb are aligned along the y-axis on each conductor 21, and this arrangement provides a matrix of memory cells MCb over the xy-plane. Each memory cell MCb includes a structure that functions as a switching element SEb and a structure that functions as a magnetoresistance effect element VRb. The structure that functions as a switching element SEb and the structure that functions as a magnetoresistance effect element VRb each have one or more layers, as will be described later.

Conductors 22 are provided above the memory cells MCb. The conductors 22 extend along the x-axis, and are aligned along the y-axis. Each conductor 22 is coupled, at its bottom surface, to the upper surfaces of memory cells MCb aligned along the x-axis. Each conductor 22 functions as a bit line BL.

Each conductor 22 is coupled, at its upper surface, to the bottom surfaces of memory cells MCa. Each memory cell MCa has, for example, a circular shape in the xy-plane. The memory cells MCa are aligned along the x-axis on each conductor 22, and this arrangement provides a matrix of memory cells MCa over the xy-plane. Each memory cell MCa includes a structure that functions as a switching element SEa and a structure that functions as a magnetoresistance effect element VRa. The structure that functions as a switching element SEa and the structure that functions as a magnetoresistance effect element VRa each have one or more layers, as will be described later.

A further conductor 21 is provided on the upper surfaces of memory cells MCa aligned along the y-axis.

The structure from the layer of the lowermost conductor 21 to the layer of the memory cell MCa shown in FIGS. 3 and 4 is repeatedly provided along the z axis, thereby making it possible to implement the memory cell array 11 shown in FIG. 2.

The memory cell array 11 further includes an interlayer insulator in a region where none of the conductors 21 and 22 and the memory cell MC are provided.

1.1.4. Structure of Memory Cell

Figure 5:
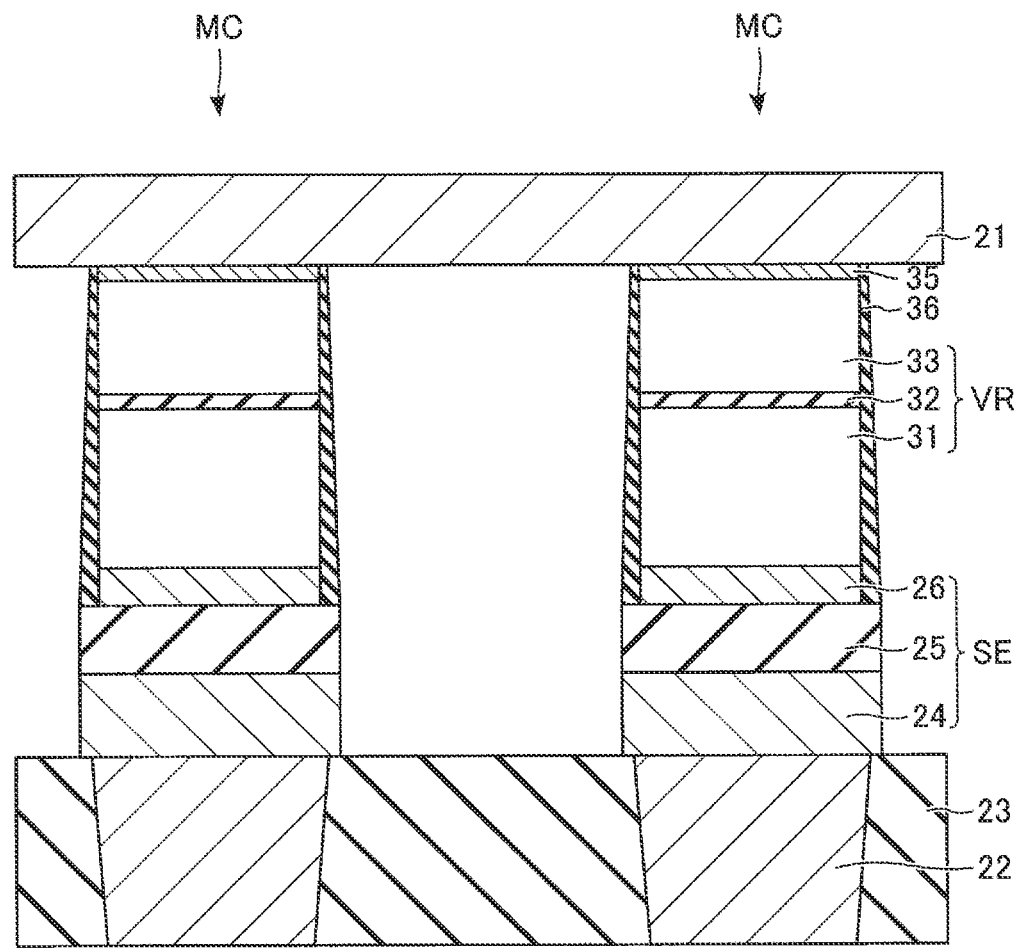
FIG. 5 shows a cross section of an example of the structure of a memory cell according to the first embodiment.

FIG. 5 shows a cross section of an exemplary structure of memory cells according to the first embodiment. FIG. 5 shows a structure from a layer at which a conductor 22 is located to the layer immediately above on which a conductor 21 is located along the z-axis. The memory cell MC shown in FIG. 5 corresponds to memory cell MCa.

As shown in FIG. 5, an interlayer insulator 23 is provided above a semiconductor substrate (not shown). The interlayer insulator 23 either includes the same material as the material of the variable resistance material 25 (described later) or is substantially made of such a material. In the specification and the claims, expressions such as "substantially" and "substantially constituted by (or, made of)" should be construed to mean that an element "substantially constituted by" something may contain unintended impurities. The interlayer insulator 23 includes silicon oxide ($SiO_2$) for example, or is substantially constituted by silicon oxide.

A conductor 22 is provided within the interlayer insulator 23. A memory cell MC is located on the upper surface of each conductor 22. Each memory cell MC includes a switching element SE, a magnetoresistance effect element VR on the switching element SE, a hardmask 35, and a side-wall insulator 36. The memory cell MC may include additional layers.

Each switching element SE is located on the upper surface of a single conductor 22. The switching element SE includes a lower electrode 24, a variable resistance material (layer) 25, and an upper electrode 26. The lower electrode 24 is positioned on the upper surface of the conductor 22. The variable resistance material 25 is positioned on the upper surface of the lower electrode 24. The upper electrode 26 is positioned on the upper surface of the variable resistance material 25.

The lower electrode 24 either includes an amorphous conductor or is made of an amorphous conductor. Examples of the conductor include an electrically conductive carbon (C), an indium tin oxide ($In_2O_3$—$SnO_2$), and a boride such as a hafnium boride (HfB (hafnium diboride ($HfB_2$)). During ion implantation of a dopant into the variable resistance material 25 as described above, the dopant passing through the variable resistance material 25 is partially introduced into the lower electrode 24. For this reason, the lower electrode 24 includes a small amount of the dopant included in the variable resistance material 25, and the upper surface of the lower electrode 24 has a higher roughness than in the case where the lower electrode 24 is not targeted for ion injection.

The variable resistance material 25 is made of a material made of an insulator and contains a dopant introduced by ion injection. The insulator includes a nitride and/or an oxide, for example a silicon nitride (SiN), a hafnium oxide ($HfO_x$), and/or $SiO_2$ or a material substantially constituted by $SiO_2$. The dopant contains, for example, arsenic (As) and/or germanium (Ge). The variable resistance material 25 is a crystalline material. Since the variable resistance material 25 is targeted for ion implantation, the upper surface of the variable resistance material 25 has a higher roughness than in the case where it is not targeted for ion injection.

The manifestation of the functions of the switching element SE and the characteristics derived from the variable resistance material 25 are dependent on a concentration of the dopant in the variable resistance material 25. The variable resistance material 25 contains a dopant at a concentration that allows the variable resistance material 25 to have the characteristics it is required to exhibit as a switching element SE. In the specification and the claims, a concentration of dopant in a certain element refers to an average concentration or a maximum concentration of the element. Specifically, the variable resistance material 25 has a dopant concentration that allows the variable resistance material 25 to have a first threshold that a voltage applied to the switching element SE must have to bring it into conduction, as described with reference to FIGS. 3 and 4.

The upper electrode 26 is made of a crystalline conductor, and includes, or is substantially made of, TiN, for example.

A single magnetoresistance effect element VR is located on the upper surface of each upper electrode 26. In the present embodiment, the magnetoresistance effect element VR exhibits a tunnel magnetoresistance effect, and descriptions will be given for a case of a magnetic tunnel junction (MTJ). Specifically, the magnetoresistance effect element VR includes a ferromagnetic layer 31, an insulating layer 32, and a ferromagnetic layer 33. As an example, as shown in FIG. 5, the insulating layer 32 is on the upper surface of the ferromagnetic layer 31, and the ferromagnetic layer 33 is on the upper surface of the insulating layer 32.

The ferromagnetic layer 31 has an easy magnetization axis in a direction penetrating the interfaces between the ferromagnetic layer 31, the insulating layer 32, and the ferromagnetic layer 33, for example at an angle from 45° to 90° with respect to the interfaces, or in a direction orthogonal to the interfaces. The direction of magnetization of the ferromagnetic layer 31 is intended to remain unchanged even when data is read or written in the magnetoresistance memory device 1. The ferromagnetic layer 31 can function as a so-called reference layer. The ferromagnetic layer 31 may include a plurality of layers.

The insulating layer 32 includes or is substantially made of, for example, magnesium oxide (MgO), and functions as a so-called "tunnel barrier".

The ferromagnetic layer 33 contains or is made of, for example, cobalt iron boron (CoFeB) or boride iron (FeB). The ferromagnetic layer 33 has an easy magnetization axis in a direction penetrating the interfaces between the ferromagnetic layer 31, the insulating layer 32, and the ferromagnetic layer 33, for example at an angle from 45° to 90° with respect to the interfaces, or in a direction orthogonal to the interfaces. The magnetization direction of the ferromagnetic layer 33 can be changed by data writing, and the ferromagnetic layer 33 can function as a so-called "storage layer".

When the magnetization direction of the ferromagnetic layer 33 is parallel to the magnetization direction of the ferromagnetic layer 31, magnetoresistance effect element VR is in a state of having a low resistance. When the magnetization direction of the ferromagnetic layer 33 is anti-parallel to the magnetization direction of the ferromagnetic layer 31, the magnetoresistance effect element VR is in a state of having a resistance higher than the resistance in the case where the magnetization directions of the ferromagnetic layers 31 and 33 are parallel to each other.

When a certain magnitude of write current flows from the ferromagnetic layer 33 to the ferromagnetic layer 31, the magnetization direction of the ferromagnetic layer 33 becomes parallel to the magnetization direction of the ferromagnetic layer 31. In contrast, when another magnitude or write current flows from the ferromagnetic layer 31 to the ferromagnetic layer 33, the magnetization direction of the ferromagnetic layer 33 becomes anti-parallel to the magnetization direction of the ferromagnetic layer 31.

The hardmask 35 is located on the upper surface of the magnetoresistance effect element VR, for example the upper surface of the ferromagnetic layer 33. The hardmask 35 is made of a conductor, and includes, or is made of, TiN, for example.

The side surface of the magnetoresistance effect element VR is covered by a side-wall insulator 36. The side-wall insulator 36 may cover the side surface of the switching element SE entirely or partially. FIG. 5 shows an example in which the side-wall insulator 36 covers the side-wall of the upper electrode 26. The side-wall insulator 36 includes a silicon nitride or is constituted by a silicon nitride, for example.

A conductor 21 is provided on the top surface of the hardmask 35 of each of the memory cells MC arranged along the y-axis.

1.1.5. Dopant Concentration of Interlayer Insulator 23

As described later, the interlayer insulator 23 also may contain a dopant included in the variable resistance material 25 through the steps of forming the variable resistance material 25. However, the dopant concentration of the interlayer insulator 23 is very low. The dopant concentration of the interlayer 23 is far lower than a concentration of the dopant contained in the variable resistance material 25, and far lower, by a few digits, than the dopant concentration required to be had by the variable resistance material 25 so as to manifest the functions of the switching element SE. In other words, the interlayer insulator 23 has a dopant concentration that allows conduction only at a voltage of a much higher threshold than the first threshold of the variable resistance material 25

1.2 Manufacturing Method

FIGS. 6 to 9 sequentially show structures of part of the magnetoresistance memory device of the first embodiment in a manufacturing process. FIGS. 6 to 9 show the same cross section as that shown in FIG. 5.

Figure 6:
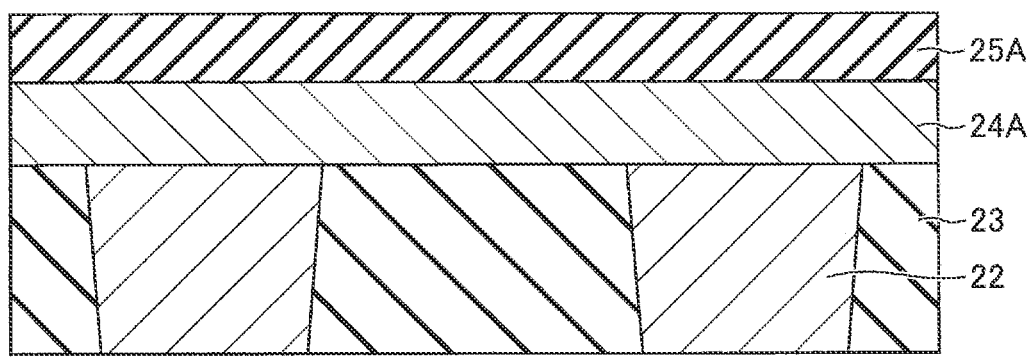
FIG. 6 shows a structure of part of the magnetoresistance memory device of the first embodiment at a point in time in a manufacturing process.
Figure 6:
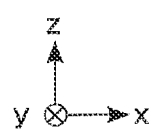

As shown in FIG. 6, a plurality of conductors 22 are formed within the interlayer insulator 23. Subsequently, on the upper surface of the interlayer insulator 23 and the upper surface of the conductor 22, the lower electrode 24A and the variable resistance material 25A are deposited in this order. Examples of the deposition method include chemical vapor deposition (CVD) and sputtering. Each of the lower electrode 24A and the variable resistance material 25A are components slated to be processed into a lower electrode 24 and a variable resistance material 25 in later steps, respectively. The lower electrode 24A is amorphous. The variable resistance material 25A includes $SiO_2$ or is substantially made of $SiO_2$, and is a crystalline material.

Figure 7:
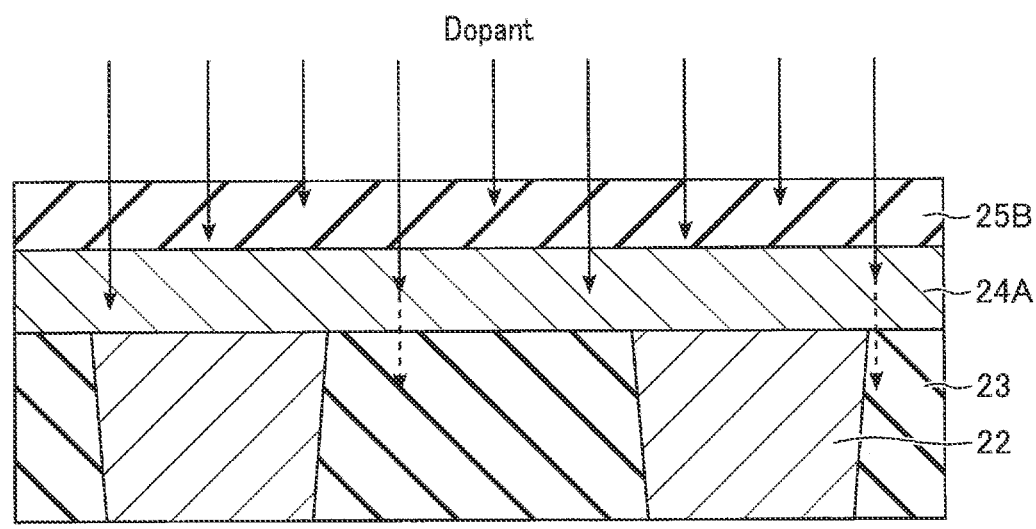
FIG. 7 shows a structure at a point in time subsequent to that shown in FIG. 6.

As shown in FIG. 7, the dopant contained in the variable resistance material 25 is introduced by ion implantation, from the upper surface of the variable resistance material 25A. As described above, the variable resistance material 25A is a crystalline material. For this reason, a channeling effect (or, channeling phenomenon) may occur in the variable resistance material 25A, and the dopant may progress toward the bottom surface of the variable resistance material 25A after entering from the upper surface of the variable resistance material 25A. When the dopant loses its energy while it progresses in the variable resistance material 25A and remains in the variable resistance material 25A, the variable resistance material 25A is formed into a variable resistance material 25B. The variable resistance material 25B is an element slated to be shaped into the variable resistance material 25 in later steps. The ion implantation may be performed in such a manner that the dopant advances along the z axis, in other words, at a perpendicular angle on the upper surface of the variable resistance material 25A.

It is desirable that the dopant be widely distributed from the upper surface to the bottom surface of the variable resistance material 25 so that the variable resistance material 25 can manifest the intended switching operations. Conditions of ion implantation, including energy, are selected so that a state as close as possible to a wide distribution of the dopant can be obtained. Ion implantation under such conditions allows some portions of the dopant to obtain a higher energy than other portions of the dopant, depending on probability. The dopant having higher energy goes beyond the bottom surface of the variable resistance material 25B and reaches the lower electrode 24A.

On the other hand, the lower electrode 24A is amorphous as mentioned above. In an amorphous substance, a channeling effect that would occur in a crystalline substance occurs almost not at all or does not occur at all. This is because atoms are not arranged in a periodic manner in an amorphous substance, unlike in a crystalline substance. For this reason, invasion of the dopant beyond the bottom surface of the lower electrode 24A and into the interlayer insulator 22 is greatly inhibited, and such invasion occurs almost not at all or does not occur at all. Similarly, invasion of the dopant into the conductor 22 is also greatly inhibited.

After the ion implantation, the upper surface of the variable resistance material 25B and the upper surface of the lower electrode 24A have higher roughnesses than those before the ion implantation is performed.

Figure 8:
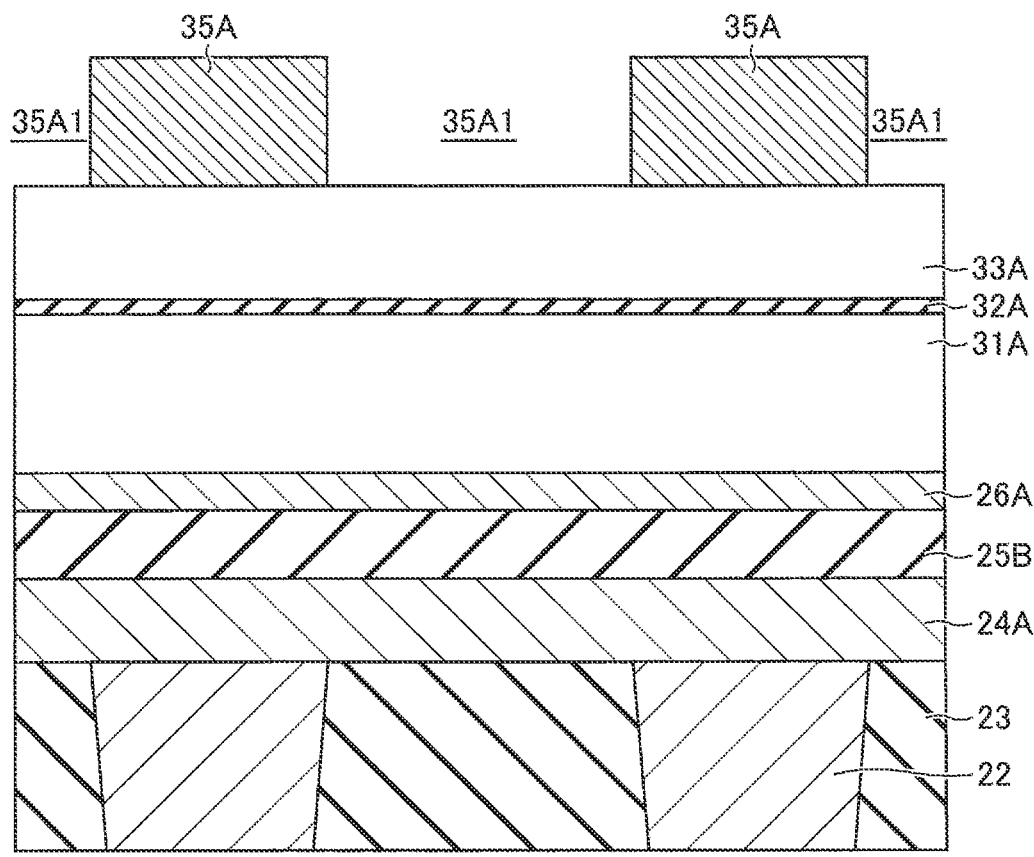
FIG. 8 shows a structure at a point in time subsequent to that shown in FIG. 7.

As shown in FIG. 8, an upper electrode 26A, a ferromagnetic layer 31A, an insulating layer 32A, ferromagnetic layer 33A, and a hardmask 35A are deposited in this order on the upper surface of the variable resistance material 25B. Examples of the deposition method include CVD and sputtering. The upper electrode 26A, the ferromagnetic layer 31A, the insulating layer 32A, and the ferromagnetic layer 33A are the components slated to be shaped into an upper electrode 26, a ferromagnetic layer 31, an insulating layer 32, and a ferromagnetic layer 33. The hardmask 35A remains immediately above the areas in which the magnetoresistance effect elements VR are slated to be formed, and has openings 35A1 in other areas. Each opening 35A1 spans the top surface to the bottom surface of the hardmask 35A.

Figure 9:
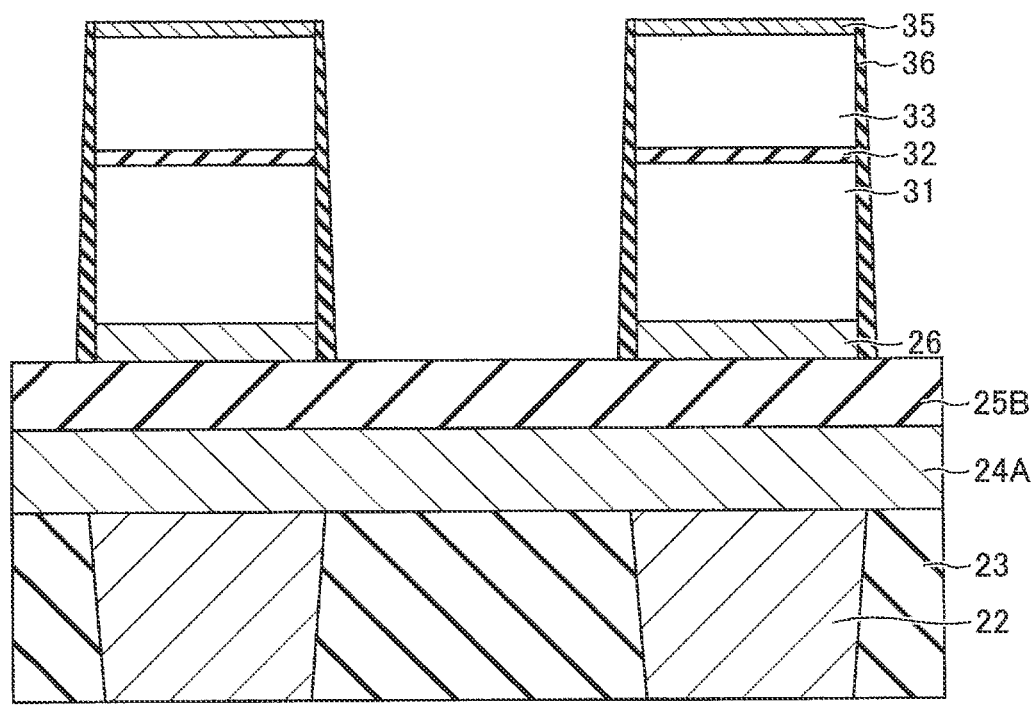
FIG. 9 shows a structure at a point in time subsequent to that shown in FIG. 8.

As shown in FIG. 9, the structure obtained through the manufacturing steps so far is partially removed by ion beam etching (IBE). The ion beam has an angle with respect to the z-axis. Such an ion beam enters the opening 35A1 of the hardmask 35A and partially removes the exposed components in the opening 35A1. Part of the ion beam is blocked by the hardmask 35A, and cannot reach deeper areas of the opening 35A1. However, the hardmask 35A is also partially removed by the IBE, and the top surface level of the hardmask 35A gradually becomes lower as the IBE progresses. As a result, the ion beam can reach deeper areas in the opening 35A1 as the IBE progresses.

The IBE is continued at least until the ferromagnetic layer 31A, the insulating layer 32A, and the ferromagnetic layer 33A are partially removed and divided into multiple sets of the ferromagnetic layer 31, the insulating layer 32, and the ferromagnetic layer 33. In order to achieve this, the IBE is performed under conditions of over-etching. For this reason, for example, as the IBE progresses, the upper electrode 26A is etched in the part inside the opening 35A1. Depending on the conditions, the etching may be performed up to the variable resistance material 25B. As a result of the etching, the ferromagnetic layer 31A, the insulating layer 32A, and the ferromagnetic layer 33A are formed into a ferromagnetic layer 31, an insulating layer 32, and a ferromagnetic layer 33. Furthermore, the upper electrode 26A is formed into the upper electrode 26. Depending on the conditions, there is a case where only the upper portion of the upper electrode 26A is removed, or a case where the variable resistance material 25A is also removed.

The hardmask 35A is partially removed and formed into a hardmask 35. Next, by the separation achieved by the IBE, in the lower portion in the opening 35A1 of the hardmask 35A, a side-wall insulator 36 is formed on the side surface of the structure in which its side surface is exposed. Based on the currently described example, a side-wall insulator 36 is formed on the side surfaces of the hardmask 35, the ferromagnetic layer 31, the insulating layer 32, the ferromagnetic layer 33, and the upper electrode 26.

As shown in FIG. 1, the variable resistance material 25B and the lower electrode 24A are partially removed by isotropic etching, using the structure consisting of the hardmask 35, the ferromagnetic layer 31, the insulating layer 32, the ferromagnetic layer 33, and the upper electrode 26 as a mask. The etching is for example RIE. By this etching, the variable resistance material 25B and the lower electrode 24A are formed into multiple sets of the variable resistance material 25 and the lower electrode 24. Next, a conductor 21 is formed.

1.3. Advantageous Effects

According to the first embodiment, a magnetoresistance memory device in which erroneous operations are inhibited can be provided, as described below.

Figure 10:
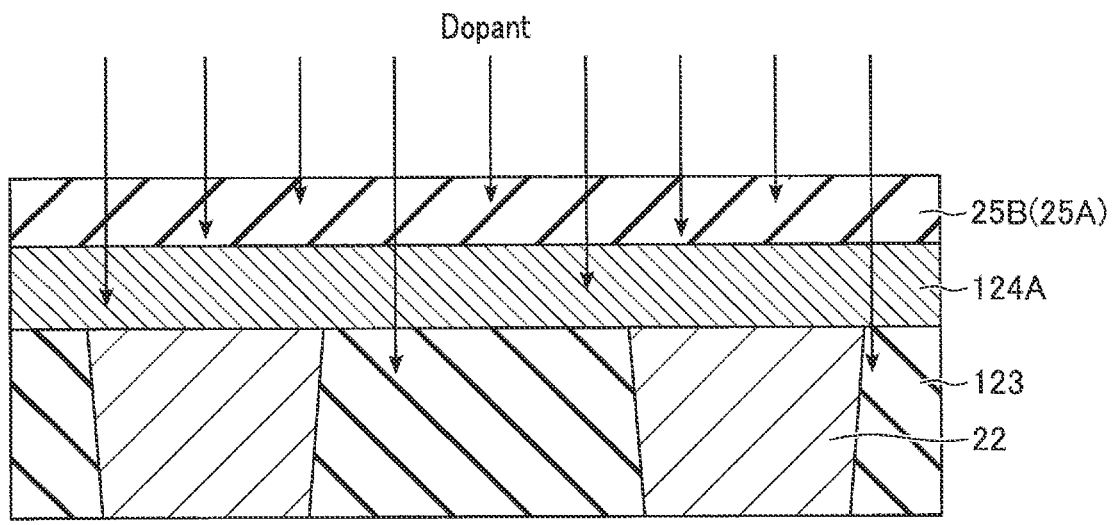
FIG. 10 shows a state of a magnetoresistance memory device in a reference manufacturing process.

A switching element capable of bidirectional operation and formed by introducing, a dopant, such as the switching element SE, can be formed by a method described below. FIG. 10 shows a state in a reference process of manufacturing a magnetoresistance memory device 1, and a structure corresponding to the part of the magnetoresistance memory device shown in FIG. 5.

As shown in FIG. 10, similarly to FIG. 7 of the first embodiment, the lower electrode 124A and the variable resistance material 25A are deposited in this order on the upper surface of the interlayer insulator 123 and the upper surface of the conductor 22A. The lower electrode 124A is a component slated to be processed into the lower electrode 124 in later steps, and has a crystalline structure. The interlayer insulator 123 and the lower electrode 124 are intended to have the same functions as those of the interlayer insulator 23 and the lower electrode 24 of the first embodiment.

Dopant is introduced into the variable resistance material 25A by ion implantation, and a variable resistance material 25B is thereby formed. Since the lower electrode 124A has a crystalline structure, a channeling effect occurs in the lower electrode 124A. The channeling effect enables the dopant that has entered the lower electrode 124A to advance in the lower electrode 124A. For this reason, a part of the dopant goes beyond the lower electrode 124A and reaches the interlayer insulator 123.

The interlayer insulator 123 containing the dopant is the same as the variable resistance material 25 containing the dopant in their compositions. For this reason, the interlayer insulator 123 may function as a switching element unintentionally. Due to this, a phenomenon as described below may occur.

Figure 11:
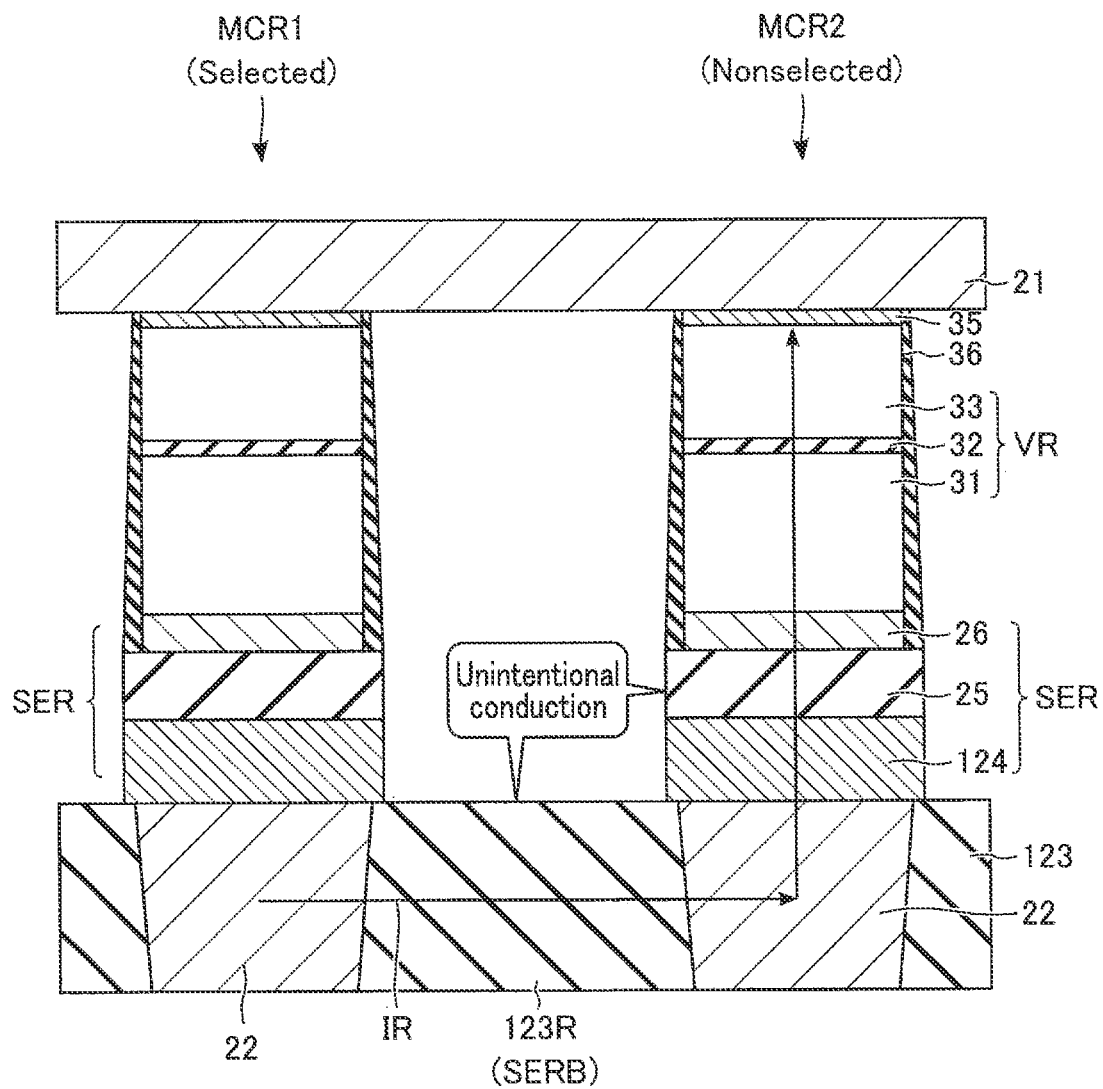
FIG. 11 shows a state of a reference magnetoresistance memory device during a certain operation.

FIG. 11 is a diagram showing a state of a reference magnetoresistance memory device during a certain operation. FIG. 11 shows the structure obtained by performing steps similar to those described with reference to FIGS. 8, 9, and 1 of the first embodiment to the state shown in FIG. 10. As shown in FIG. 11, the memory cell MCR1 on the left is selected, and a voltage that turns on the switching element SER is applied to the conductor 22 below the lower portion of the memory cell MCR1 and the conductor 21, and a current is flowing. As described with reference to FIG. 10, the interlayer insulator 123R between the conductor 22 below the memory cell MCR1 and the conductor 22 below the memory cell MCR2 may function as a switching element SERB similar to the switching element SE. For this reason, depending on a combination of various factors such as an amplitude of voltage, etc., the switching element SERB becomes conductive (or, is turned on), and a current IR flows between the conductor 22 below the memory cell MCR1 and the conductor 22 below the memory cell MCR2. Furthermore, when the current IR flows in the switching element SER of the memory cell MCR2, the switching element SER can be made conductive. This phenomenon may inhibit correct data reading in the memory cell MCR1 and may cause an erroneous read.

According to the magnetoresistance memory device 1 of the first embodiment, each switching element SE includes the amorphous lower electrode 24. Due to this, the interlayer insulator 23 has a dopant concentration that is far lower than that the variable resistance material 25 needs to have to manifest the functions of the switching element SE and an actual dopant concentration of the variable resistance material 25. For this reason, the interlayer insulator 23 is inhibited or prevented from functioning as a switching element similar to the switching element SE. For this reason, even by the application of a voltage to a selected memory cell MC to read data from the selected memory cell MC, conduction of the interlayer insulator 23 can be inhibited or prevented. Conduction of a switching element SE of a non-selected memory cell MC can also be inhibited or prevented. It is thereby possible to provide a magnetoresistance memory device 1 in which an erroneous operation, particularly an erroneous read operation, is inhibited.

2. Second Embodiment

The second embodiment differs from the first embodiment in the structure of the switching element. The rest of the second embodiment is the same as the first embodiment. The points of the structure of the second embodiment that differ from those of the first embodiment will be mainly described below.

2.1. Structure

Figure 12:
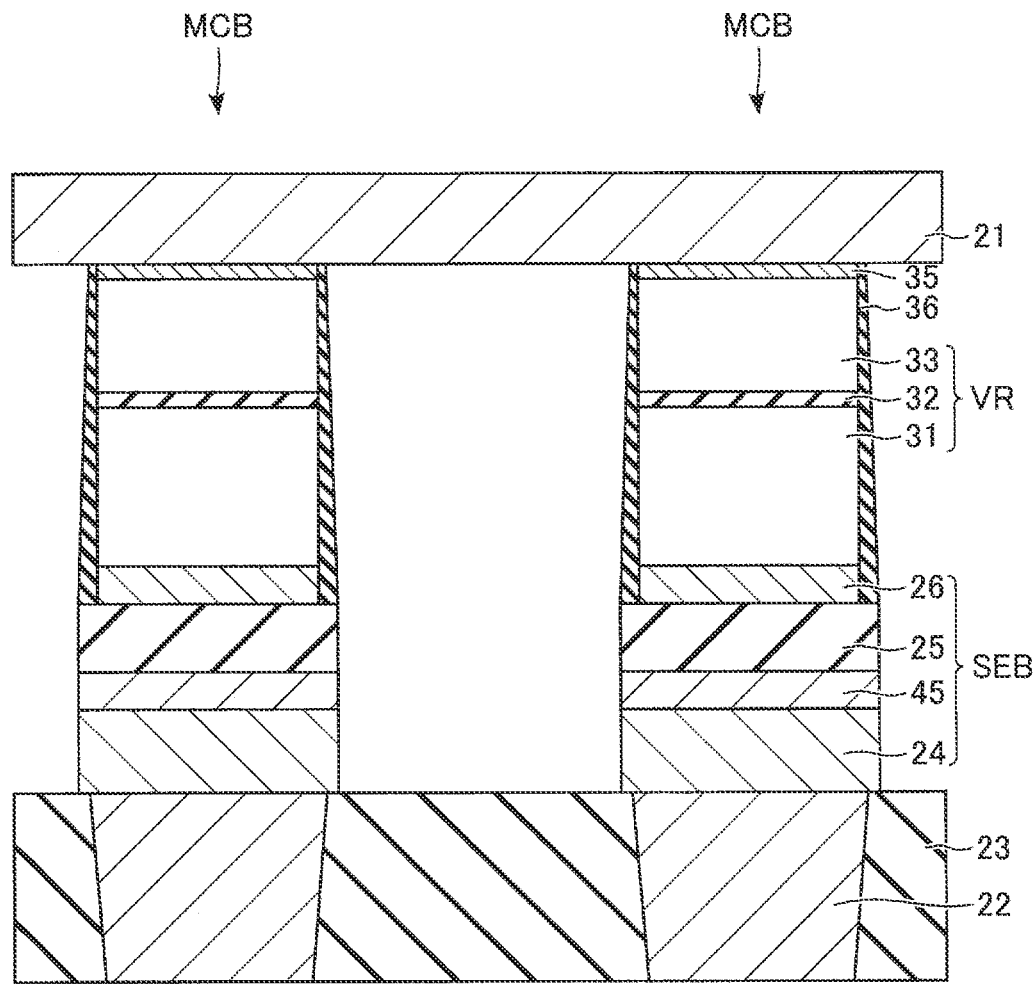
FIG. 12 shows a structure of part of the magnetoresistance memory device of the second embodiment at a point in time in a manufacturing process.

FIG. 12 shows a cross section of an exemplary structure of memory cells according to the second embodiment, showing the same area as that shown in FIG. 5 of the first embodiment. To distinguish from the memory cell MC and the switching element SE of the first embodiment, the memory cell MC and the switching element SE according to the second embodiment may be referred to as a "memory cell MCB" and a "switching element SEB", respectively. Each memory cell MCB includes a lower electrode 45 in addition the components included in the memory cell MC.

The lower electrode 45 is positioned on the upper surface of the lower electrode 24 and is made of a crystalline conductor; for example, the lower electrode 45 includes, or is substantially made of, crystalline TiN. Since the lower electrode 45 is targeted for ion implantation, it has a higher roughness on its upper surface than in a case where the lower electrode 45 is not targeted for ion implantation.

The variable resistance material 25 is positioned on the upper surface of the lower electrode 45.

2.2. Manufacturing Method

Figure 13:
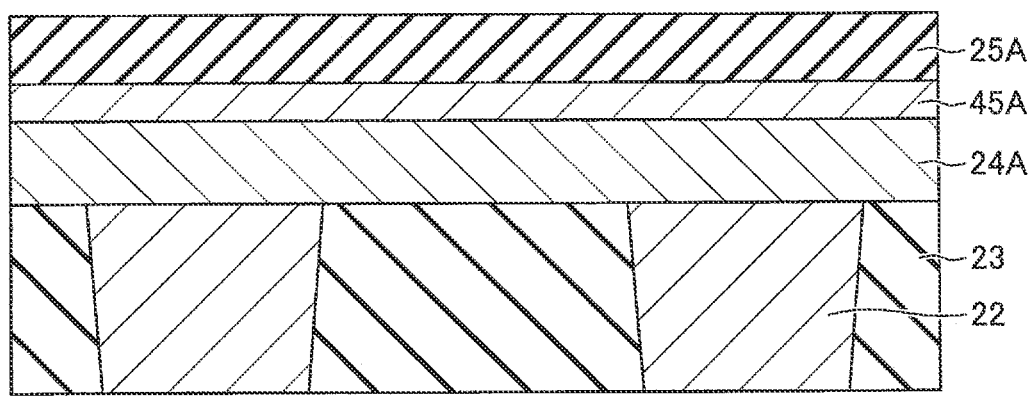
FIG. 13 shows a structure of part of the magnetoresistance memory device of the first embodiment at a point in time in a manufacturing process.

FIG. 13 shows a structures of part of the magnetoresistance memory device of the second embodiment in a manufacturing process. FIG. 13 shows the same cross section as that shown in FIG. 12.

As shown in FIG. 13, the lower electrode 24A is formed on the upper surface of the interlayer insulator 23 and the upper surface of the conductor 22 by a step similar to that shown in FIG. 6 of the first embodiment. Subsequently, the lower electrode 45A is formed on the upper surface of the lower electrode 24A. Examples of the deposition method include CVD and sputtering. The lower electrode 45A is a component slated to be shaped into the lower electrode 45 in later steps, and has a crystalline structure. The variable resistance material 25A is formed on the upper surface of the lower electrode 45A by the same step as that shown in FIG. 6.

Figure 14:
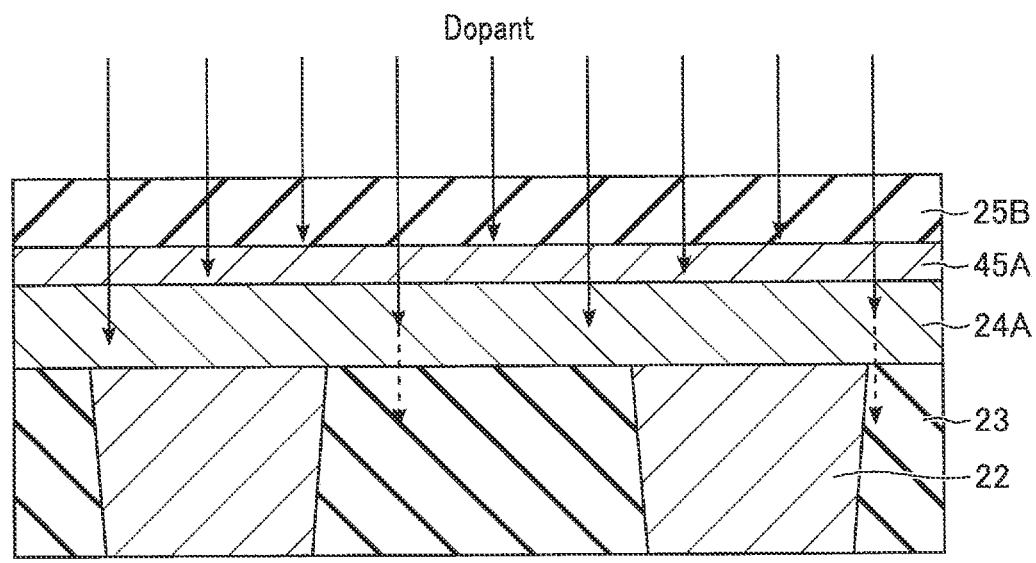
FIG. 14 shows a structure at a point in time subsequent to that shown in FIG. 13.
Figure 14:
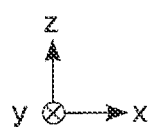

As shown in FIG. 14, a dopant is introduced into the variable resistance material 25A by ion implantation by a step similar to that shown in FIG. 7 of the first embodiment. The dopant may enter the lower electrode 45A, and may enter also the lower electrode 24A due to the channeling effect that occurs in the lower electrode 45A. However, entering of the dopant beyond the bottom surface of the lower electrode 24A and into the interlayer insulator 23 is greatly inhibited, and such entering occurs almost not at all or does not occur at all.

The steps hereinafter are the same as those described with reference to FIGS. 8, 9, and 1 of the first embodiment, except that the lower electrode 45A is provided between the lower electrode 24A and the variable resistance material 25A. Specifically, an upper electrode 26A, a ferromagnetic layer 31A, an insulating layer 32A, a ferromagnetic layer 33A, and a hardmask 35A are formed by the same step as that shown in FIG. 8. The ferromagnetic layer 31A, the insulating layer 32A, and the ferromagnetic layer 33A, and the upper electrode 26A are formed into a ferromagnetic layer 31, an insulating layer 32, a ferromagnetic layer 33, and an upper electrode 26 by the same step as that shown in FIG. 9. Furthermore, a side-wall insulator 36 is formed on the side surfaces of the hardmask 35, the ferromagnetic layer 31, the insulating layer 32, the ferromagnetic layer 33, and the upper electrode 26A.

By the same step as the step described with reference to FIG. 1, as shown in FIG. 11, the variable resistance material 25B and the lower electrode 24A are formed into multiple sets of the variable resistance material 25 and the lower electrode 24, and subsequently, a conductor 21 is formed.

2.3. Advantages

According to the second embodiment, each switching element SE includes the amorphous lower electrode 24, similarly to the first embodiment. Therefore, the same advantages as those of the first embodiment can be obtained.

2.4. Modifications

Figure 15:
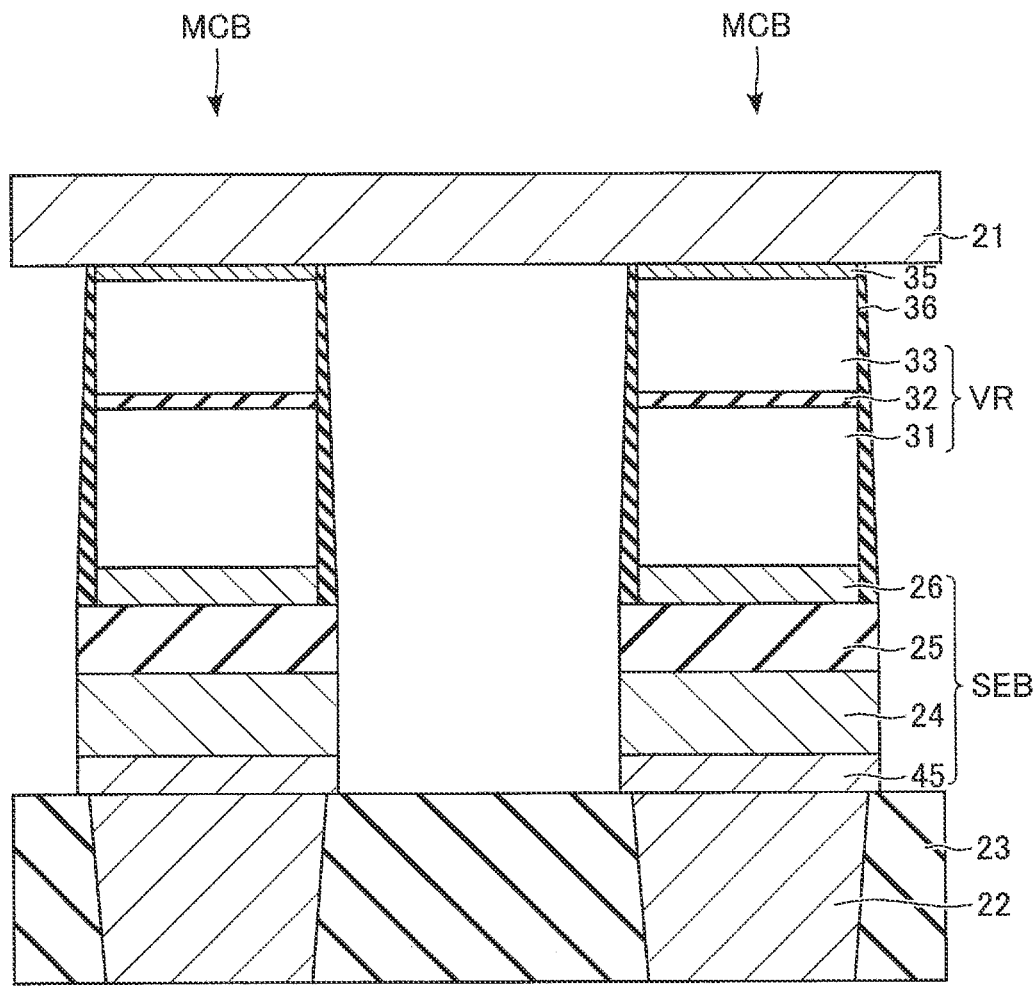
FIG. 15 shows a structure of part of the magnetoresisitance memory device of a modification of the second embodiment at a point in time in a manufacturing process.

As shown in FIG. 15, the lower electrode 45 may be provided between the conductor 22 and the lower electrode 24. According to the modification, it is possible to achieve the same advantageous effects as those achieved by the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistance memory device, comprising:
a first conductor;
a first silicon oxide surrounding a side surface of the first conductor;
a second conductor on the first conductor, the second conductor being amorphous;
a first element on the second conductor, the first element comprising a silicon oxide introduced with an ion-implanted dopant;
a third conductor on the first element; and
a first layer stack on the third conductor, the first layer stack including a first magnetic layer, a second magnetic layer, and a first insulating layer between the first magnetic layer and the second magnetic layer,
wherein:
the first silicon oxide contains the dopant, and
a concentration of the dopant in the first silicon oxide is lower than a concentration of the dopant in the first element.

2. The device according to claim 1, further comprising:
a fourth conductor surrounded by the first silicon oxide.

3. The device according to claim 2, further comprising:
a fifth conductor on the fourth conductor, the fifth conductor being amorphous;
a second element on the fifth conductor, the second element comprising a silicon oxide introduced with the dopant;
a sixth conductor on the second element; and
a second layer stack on the sixth conductor, the second layer stack including a third magnetic layer, a fourth magnetic layer, and a second insulating layer between the third magnetic layer and the fourth magnetic layer.

4. The device according to claim 1, wherein the second conductor comprises one or more of an electrically conductive carbon, an indium tin oxide, a hafnium boride, and a boride.

5. The device according to claim 1, wherein the dopant contains one or more of arsenic and germanium.

6. The device according to claim 1, wherein the third conductor comprises a crystalline material.

7. The device according to claim 1, wherein the concentration of the dopant in the first silicon oxide is lower than the concentration of the dopant in the first element by plural digits.

8. The device according to claim 1, wherein the first silicon oxide is on the side surface of the first conductor.

9. The device according to claim 1, wherein the first element is the silicon oxide introduced with the ion-implanted dopant.

10. A magnetoresistance memory device, comprising:
a first conductor;
a first silicon oxide surrounding a side surface of the first conductor;
a second conductor on the first conductor silicon oxide, the second conductor being amorphous;
a third conductor on the second conductor;
a first element on the third conductor, the first element comprising a silicon oxide introduced with an ion-implanted dopant;
a fourth conductor on the first element; and a first layer stack on the fourth conductor, the first layer stack including a first magnetic layer, a second magnetic layer, and a first insulating layer between the first magnetic layer and the second magnetic layer, wherein:

the first silicon oxide contains the dopant, and a concentration of the dopant in the first silicon oxide is lower than a concentration of the dopant in the first element.

11. The device according to claim 10, further comprising: a fifth conductor surrounded by the first silicon oxide.

12. The device according to claim 10, further comprising:

a sixth conductor on the fifth conductor, the sixth conductor being amorphous;

a second element on the sixth conductor, the second element comprising a silicon oxide introduced with the dopant;

a seventh conductor on the second element; and a second layer stack on the seventh conductor, the second layer stack including a third magnetic layer, a fourth magnetic layer, and a second insulating layer between the third magnetic layer and the fourth magnetic layer.

13. The device according to claim 10, wherein the second conductor comprises one or more of an electrically conductive carbon, an indium tin oxide, a hafnium boride, and a boride.

14. The device according to claim 10, wherein the dopant contains one or more of arsenic and germanium.

15. The device according to claim 10, wherein the concentration of the dopant in the first silicon oxide is lower than the concentration of the dopant in the first element by plural digits.

16. The device according to claim 10, wherein the first silicon oxide is on the side surface of the first conductor.

17. The device according to claim 10, wherein the first element is the silicon oxide introduced with the ion-implanted dopant.

* * * * *